United States Patent
Kojima et al.

(10) Patent No.: US 9,851,394 B2
(45) Date of Patent: Dec. 26, 2017

(54) PARTIAL-DISCHARGE MEASUREMENT METHOD AND HIGH-VOLTAGE DEVICE INSPECTED USING SAME

(71) Applicant: Hitachi, Ltd., Chiyoda-ku, Tokyo (JP)

(72) Inventors: Hiroaki Kojima, Tokyo (JP); Koji Obata, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/914,186

(22) PCT Filed: Aug. 28, 2013

(86) PCT No.: PCT/JP2013/072940
§ 371 (c)(1),
(2) Date: Feb. 24, 2016

(87) PCT Pub. No.: WO2015/029151
PCT Pub. Date: Mar. 5, 2015

(65) Prior Publication Data
US 2016/0216309 A1 Jul. 28, 2016

(51) Int. Cl.
*G01R 31/08* (2006.01)
*G01R 31/34* (2006.01)
(Continued)

(52) U.S. Cl.
CPC ......... *G01R 31/08* (2013.01); *G01R 19/0053* (2013.01); *G01R 29/0814* (2013.01); *G01R 31/1263* (2013.01); *G01R 31/346* (2013.01)

(58) Field of Classification Search
CPC combination set(s) only.
See application file for complete search history.

(56) References Cited

U.S. PATENT DOCUMENTS

| 5,530,364 A * | 6/1996 | Mashikian | G01R 31/083 324/242 |
| 2007/0057677 A1* | 3/2007 | Koch | G01R 31/1227 324/536 |
| 2011/0241697 A1 | 10/2011 | Omatsu et al. | |

FOREIGN PATENT DOCUMENTS

| JP | 64-91072 A | 4/1989 |
| JP | 2005-69745 A | 3/2005 |

(Continued)

OTHER PUBLICATIONS

International Search Report (PCT/ISA/210) issued in PCT Application No. PCT/JP2013/072940 dated Dec. 3, 2013 with English-language translation (three (3) pages).

*Primary Examiner* — Clayton E Laballe
*Assistant Examiner* — Jas Sanghera
(74) *Attorney, Agent, or Firm* — Crowell & Moring LLP

(57) ABSTRACT

The present invention provides a partial-discharge measurement method in which a partial-discharge defect signal and noise are separated, a partial-discharge defect position is detected, and the risk of a detected partial discharge defect is diagnosed. Further, this method provides a highly reliable high-voltage device. An electromagnetic wave generated by a sample is simultaneously measured by a plurality of sensors. A partial discharge and noise are separated through the comparison of the spatial intensity distribution of measured signals and a spatial signal intensity distribution measured beforehand at the time of the occurrence of a partial discharge, and a defect position is detected using a peak position. Further, the risk of a defective site is diagnosed on the basis of a simultaneously measured charge amount signal.

8 Claims, 6 Drawing Sheets

(51) Int. Cl.
*G01R 29/08* (2006.01)
*G01R 31/12* (2006.01)
*G01R 19/00* (2006.01)

(56) References Cited

FOREIGN PATENT DOCUMENTS

JP     2010-117298 A     5/2010
JP     2011-215067 A     10/2011

\* cited by examiner

PARTIAL-DISCHARGE MEASUREMENT METHOD AND HIGH-VOLTAGE DEVICE INSPECTED USING SAME

TECHNICAL FIELD

The present invention relates to a partial discharge measurement method for a high-voltage device, particularly, high-voltage rotating machines (generator and motor).

BACKGROUND ART

Due to recent improvement on an operation rate of a device, higher reliability on a high-voltage electric power device is earnestly demanded more than ever. Known typical factors of troubles which may jeopardize reliability of such high-voltage electric power devices are insulation deterioration and a breakdown phenomenon. As a detecting means for an insulation defect that may cause such insulation deterioration and breakdown, partial discharge measurement is widely used now. Further, there is also a proposed partial discharge measurement method whereby not only existence but also a position of a partial discharge defect is located. For example, there is a related art described below as such a detecting means for a partial discharge defect position. According to this related art, a partial discharge measurement sensor circumferentially swept along a surface of a stator winding of a rotating machine, and the partial discharge defect position is located by detecting a position where intensity of a measured signal becomes highest. Alternatively, a position of a partial discharge defect is located by detecting a position where a difference of arrival time between signals measured by a plurality of sensors becomes largest. This kind of method is effective in a low-voltage rotating machine where there is extremely few number of partial discharge defects and measurement can be easily performed in an environment with little ambient noise, such as a shield room, because a sample size is small. However, in a high-voltage device represented by a high-voltage generator and a motor that may have numerous partial discharge defects inside an insulation layer, partial discharge occurs at a plurality of positions. Therefore, a position where signal intensity is highest or a difference of signal arrival time is largest does not clearly appear, and the partial discharge defect position can be hardly detected. Further, in general, the high-voltage device has large capacity and a large size. Therefore, the high-voltage device can be hardly brought into a shield room for testing, and in many cases, partial discharge has to be measured in an environment with much ambient noise. Under such an environment, there may be problems in which noise intrudes inside measurement data while the sensor is swept around, and correct signal intensity distribution of partial discharge cannot be measured. Moreover, even though the partial discharge defect position can be located, there is a difference in a risk between a defect extending in an electric field direction and a defect extending in a direction orthogonal to the electric field. Therefore, a site having a large apparent charge of partial discharge is not always a defect position having a high risk, and there may be a problem in which risk assessment cannot be performed only with intensity distribution of partial discharge signals.

To solve such a problem in risk assessment, attempted in recent years is a method in which a risk of a defect is diagnosed by measuring a following pattern: a voltage phase of partial discharge occurrence-an apparent charge of partial discharge-number of occurrence of partial discharge (hereinafter, abbreviated as pattern $\phi$-q-n). However, even in this method, the patterns $\phi$-q-n of a plurality of partial discharge signals are superimposed in a high-voltage rotating electrical machine having numerous partial discharge defects, and there may be problems in which defect detection in a product and risk assessment cannot be correctly performed.

CITATION LIST

Patent Literature

PTL 1: Publication of JP 2005-69745 A

SUMMARY OF INVENTION

Technical Problem

The present invention is directed to providing a partial discharge measurement method in which a partial discharge defect signal and noise are separated, a partial discharge defect position is detected, and further a risk of the detected partial discharge defect is assessed. Also, the present invention is directed to providing a highly reliable high-voltage device using this method.

Solution to Problem

The objects of the present invention can be implemented by following methods. First, a plurality of (preferably, three or more) electromagnetic sensors is combined and forms a partial discharge sensor while a relative positional relation (distance and angle) is kept between the sensors. Next, spatial intensity distribution of electromagnetic signals at the time of occurrence of partial discharge is measured by the sensors at the same time. The partial discharge and noise are separated by comparing a relative relation of signal intensity measured by the respective electromagnetic sensors constituting the partial discharge sensor with preliminarily-measured spatial intensity distribution at the time of occurrence of the partial discharge. Further, a peak position is obtained by comparing preliminarily-measured signal intensity distribution with measured signal distribution, thereby locating a defect position. Finally, a risk can be assessed by analyzing the $\phi$-q-n pattern, current signal waveforms, and FFT waveforms of the partial discharge signal at the located defect position.

Advantageous Effects of Invention

The present invention can provide the partial discharge measurement method in which a partial discharge defect signal and noise are separated, a partial discharge defect position is detected, and a risk of the detected partial discharge defect is assessed. Further, a highly reliable high-voltage device can be provided by providing the partial discharge measurement method for a rotating electrical machine using the present method.

DESCRIPTION OF EMBODIMENTS

Figure 1:
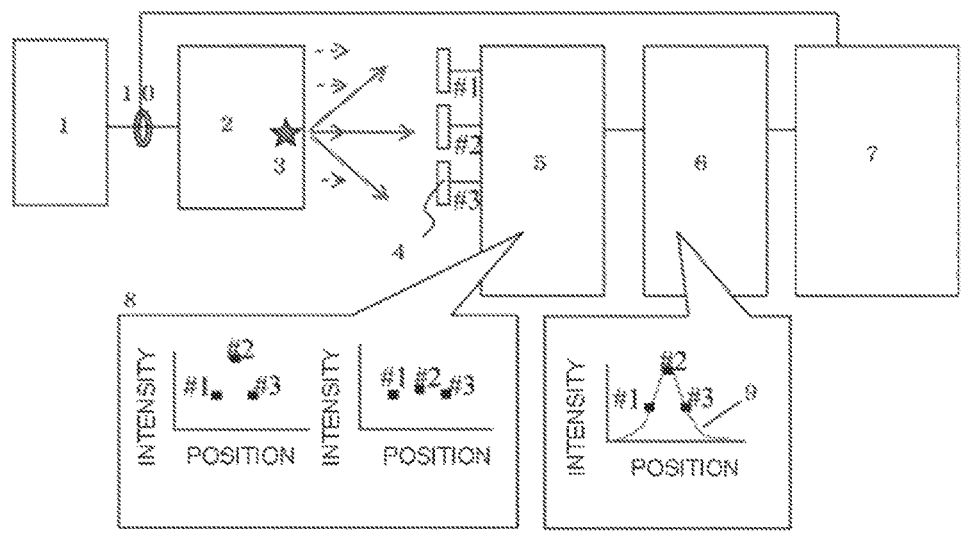
FIG. 1 is a configuration diagram illustrating a partial discharge measurement system according to the present invention.

An embodiment of the present invention will be described below using the drawings. FIG. 1 is a configuration diagram of a partial discharge measurement system according to the present invention. Here, reference sign 1 indicates a high-voltage test power source, 2 is a sample, 3 a partial discharge defect inside the sample, 4 an electromagnetic sensor, 5 an electromagnetic signal measuring instrument, 6 a signal spatial intensity distribution comparator, and 7 is a device for partial discharge/noise detection, defect position location, and risk assessment. According to the present measurement system, high voltage such as AC, impulse, or direct current is applied to the sample 2 at the high-voltage test power source 1. At this point, a signal emitted from the sample 2 is detected by a partial discharge detection sensor formed of electromagnetic sensors #1, #2, #3 having mutually fixed relative positions, and signal intensity at each of the electromagnetic sensors is measured by the electromagnetic signal measuring instrument 5. At this point, there are at least two kinds of measured signals, more specifically, an electromagnetic signal generated at the partial discharge defect 3 and an electromagnetic signal intruding from the power source side, and patterns of the respective signals are measured. The signal patterns are illustrated at reference sign 8. In the signal spatial intensity distribution comparator 6, at least these two kinds of signals are compared with electromagnetic spatial signal intensity distribution 9 of partial discharge preliminarily obtained through simulation or measurement, and comparison is made whether any of plots of signal intensity of the electromagnetic sensors #1, #2, #3 match the electromagnetic spatial signal intensity distribution 9 of partial discharge. Alternatively, comparison is made whether any of the plots of signal intensity of the electromagnetic sensors #1, #2, #3 match a relative signal intensity ratio between these electromagnetic sensors #1, #2, #3 obtained from a function of the electromagnetic spatial signal intensity distribution 9 of partial discharge. Next, a signal is transmitted to the device for partial discharge/noise detection, defect position location, and risk assessment 7. In the case where the signal is obtained from matching with the electromagnetic spatial signal intensity distribution of partial discharge, an occurring position of partial discharge is located based on a peak intensity position in the preliminarily-obtained electromagnetic spatial signal intensity distribution 9 of partial discharge. Further, along with the above-described electromagnetic signal measurement, a signal and data measured by an apparent charge of partial discharge detector 10 are combined, and the pattern φ-q-n at the occurring position of partial discharge is created. Then, a risk of the detected partial-discharge defect is assessed.

Meanwhile, in the partial discharge measurement system of FIG. 1, in the case where the electromagnetic sensors are charged at high voltage, a person who performs measurement can be prevented from electrical shock by using electric-optic conversion and photo-electric conversion in at least one of signal connecting portions of the electromagnetic signal measuring instrument, signal spatial intensity distribution comparator, and device for partial discharge/noise detection, defect position location, and risk assessment.

Figure 2:
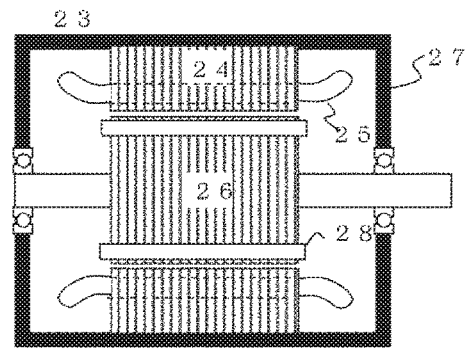
FIG. 2 is a cross-sectional view illustrating a rotating electrical machine.

A measurement method in the case of using a rotating electrical machine (generator or motor) as the sample 2 in FIG. 1 will be described by using FIGS. 2 to 4. FIG. 2 is a cross-sectional view illustrating the rotating electrical machine. Reference sign 23 indicates the rotating electrical machine, 24 is a stator, 25 a stator winding, 26 a rotor, 27 a frame, and 28 is a secondary winding, field winding, or a permanent magnet. In an induction motor or a synchronous motor, a rotational magnetic field is generated by applying AC to the stator winding 25 inserted into the stator 24, thereby rotating the rotor 26. In the case of the induction motor, a secondary winding is disposed in the rotor 26, and in the case of the synchronous motor, a field winding or a permanent magnet is disposed in 28, and rotation is made at a speed according to the rotational magnetic field.

Figure 3:
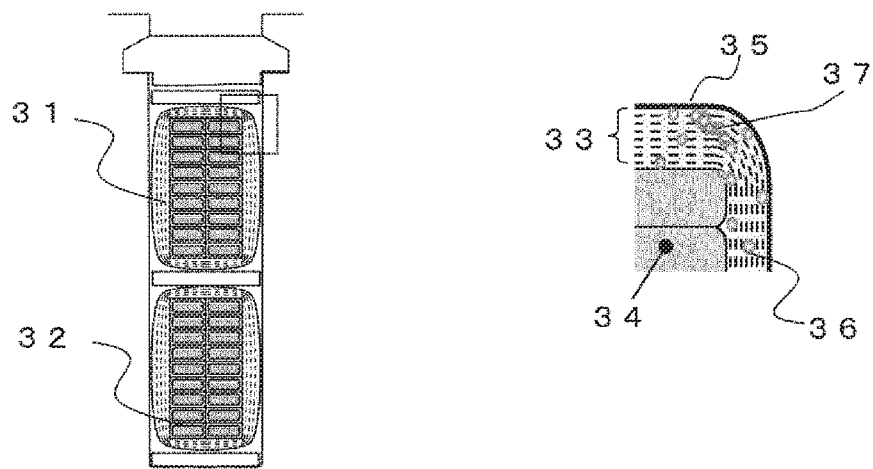
FIG. 3 is a cross-sectional view illustrating a stator winding of the rotating electrical machine.

FIG. 3 is a cross-sectional view illustrating the stator winding 25 applied with high voltage. Reference sign 31 indicates a slot top coil, and reference sign 32 indicates a slot bottom coil. Additionally, an enlarged view of an insulation layer 33 of the coil is illustrated on a right side in FIG. 3. Reference sign 33 indicates the insulation layer, 34 is a high-voltage conductor, and 35 is an ground potential layer. In the insulation layer 33 of the coil in the high-voltage rotating electrical machine, there are numerous voids indicated by white circles ○. Further, besides the voids, there is also a defect 37 extending in the electric field direction from the high-voltage electrode 34 to the ground potential layer 35. Thus, since there is a plurality of insulation defects inside the insulation layer of the high-voltage rotating electrical machine, a defect extending in the electric field direction and having a high risk is detected by the present invention.

Figure 4:
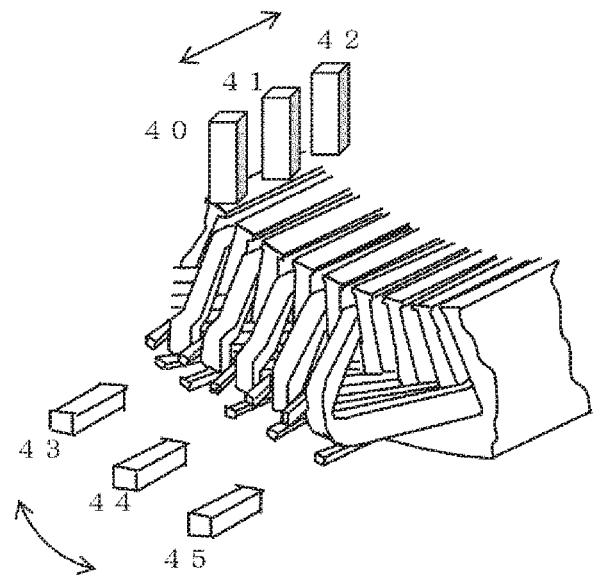
FIG. 4 is a schematic diagram illustrating a partial discharge measurement method for the winding of the rotating electrical machine using the partial discharge measurement system according to the present invention.

FIG. 4 illustrates a moving method of the sensor according to the present invention. In the stator of the rotating electrical machine, a partial discharge detection sensor formed of electromagnetic sensors 43, 44, 45 keeping a relative distance from each other in a circumferential direction is disposed at an end portion projecting from a core of the stator winding, and measures electromagnetic signal spatial intensity distribution in the circumferential direction. Further, a partial discharge detection sensor formed of the electromagnetic sensors 40, 41, 42 keeping a relative distance from each other in an axial direction is disposed on an inner diameter side of the stator winding, and measures electromagnetic signal spatial intensity distribution in the axial direction.

Figure 5:
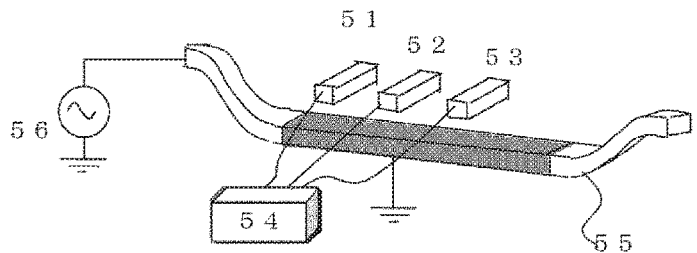
FIG. 5 is a schematic diagram illustrating the partial discharge measurement method for a single coil using the partial discharge measurement system according to the present invention.

While the exemplary case where the stator winding of the rotating electrical machine is used as the sample has been described above, FIG. 5 illustrates a case where a single coil of a rotating electrical machine is used as the sample 2 of the partial discharge measurement system according to the present invention. References signs 51, 52, 53 indicate electromagnetic sensors. Reference sign 54 is a box that integrally houses: the electromagnetic signal measuring instrument 5; signal spatial intensity distribution comparator 6; and device for partial discharge/noise detection, defect position location, and risk assessment 7 in FIG. 1. The three sensors of the electromagnetic sensors 51, 52, 53 keep a relative distance from each other in an axial direction of the single coil. Signal intensity distribution of these three sensors is measured and spatial signal intensity distribution is analyzed, thereby detecting a partial discharge defect in the single coil.

Figure 6:
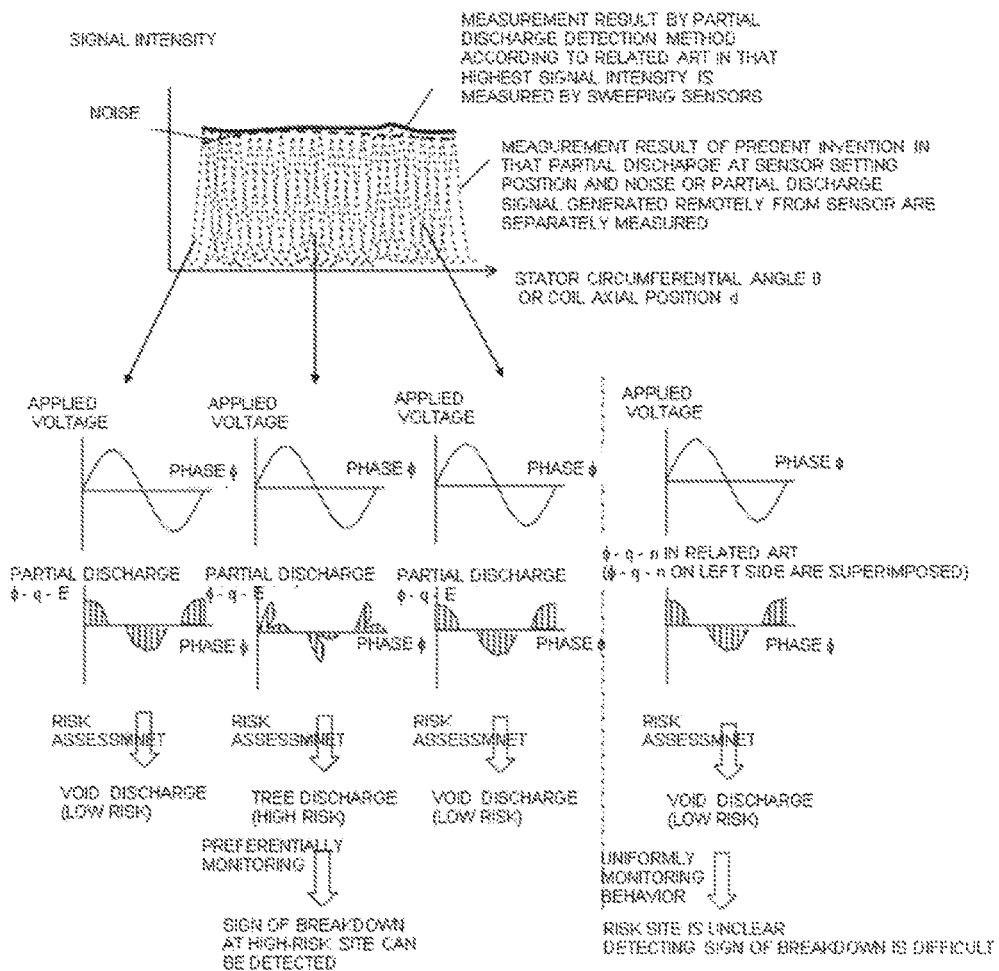
FIG. 6 is a comparative diagram between a partial discharge detection method in the related art and a partial discharge detection method and a risk assessment method according to the present invention.

FIG. 6 is an explanatory diagram to compare the present invention with a partial discharge defect detection method in the related art. A solid line in an upper part of the diagram in FIG. 6 indicates measured signal intensity in the case where the highest signal intensity is measured by, for example, sweeping sensors in a target high-voltage device as disclosed in JP 2005-69745 A. A horizontal axis represents a stator circumferential angle θ or a coil axial position d. In the high-voltage device, there are numerous partial discharge defects different from a low-voltage rotating electrical machine. Further, since the high-voltage device has a large size, it is difficult to perform measurement inside a shield room and also it takes long time to perform measurement. Therefore, ambient noise may be mixed and signal distribution may be broad. Especially, in the case where noise (thick wave line) is high as illustrated in the drawing, there is a possibility that a risk assessing method itself cannot be performed in the method of the related art in which risk is assessed based on a peak intensity. In contrast, according to the present invention, partial discharge at a sensor setting position can be measured separately from noise or a partial discharge signal generated remotely from the sensor. Therefore, an apparent charge of partial discharge occurring at each of the positions in the circumferential direction or in the axial direction, more specifically, a partial discharge defect at each of the positions can be detected and measured. Next, a φ-q-n characteristic at each of the positions each of partial discharge defects) can be obtained by combining the partial discharge signal detection and measurement with signal measurement using an apparent charge of partial discharge detector indicated by the reference sign 10 in FIG. 1. As a result, a defect type in each of the sites can be correctly grasped, especially, regarding a site in which φ-q-n characteristic of a defect such as a tree or a crack extending in the electric field direction is observed, a sign of breakdown at a high-risk site can be detected by monitoring the high-risk site more preferentially than other sites, and it is possible to provide a high-voltage device more reliable than that in the related art. In contrast, according to the φ-q-n characteristic measurement in the related art, obtained is a φ-q-n pattern formed of superimposed φ-q-n patterns of various sites. Therefore, there may be a problem in which existence of a high-risk defect is masked by the φ-q-n patterns of numerous low-risk defects, and risk assessment cannot be sufficiently performed. According to the present invention, a more highly-accurate risk assessment and a more reliable high-voltage device than the related art can be provided by analyzing the partial discharge defect position and the discharge characteristic at the site thereof as described above. Meanwhile, although not illustrated, a lifetime consumption rate defined by multiplying separately-measured voltage distribution (load distribution) inside a device may be set as a new parameter, and risk assessment can be performed by monitoring fluctuation of this parameter value in a device or the like in which a load fluctuates day by day.

Figure 7:
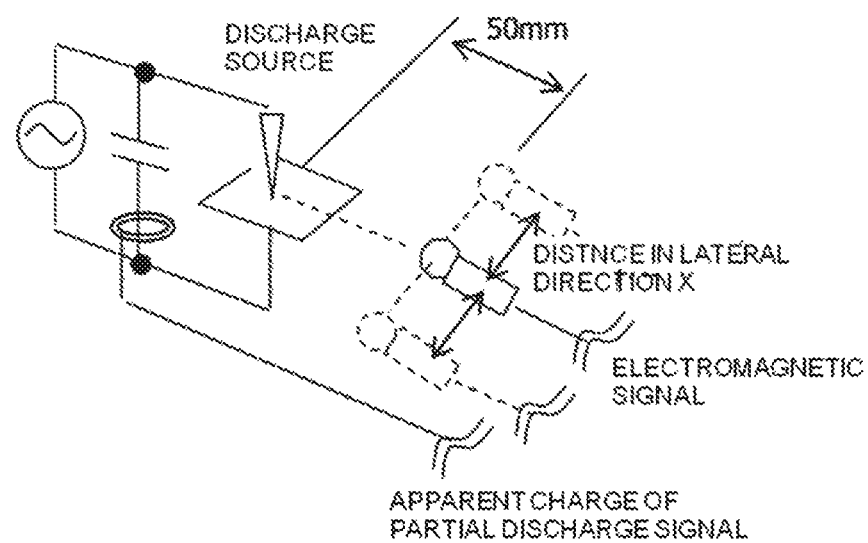
FIG. 7 is a diagram illustrating a verification test model for principles of an idea of the present invention.
Figure 8:
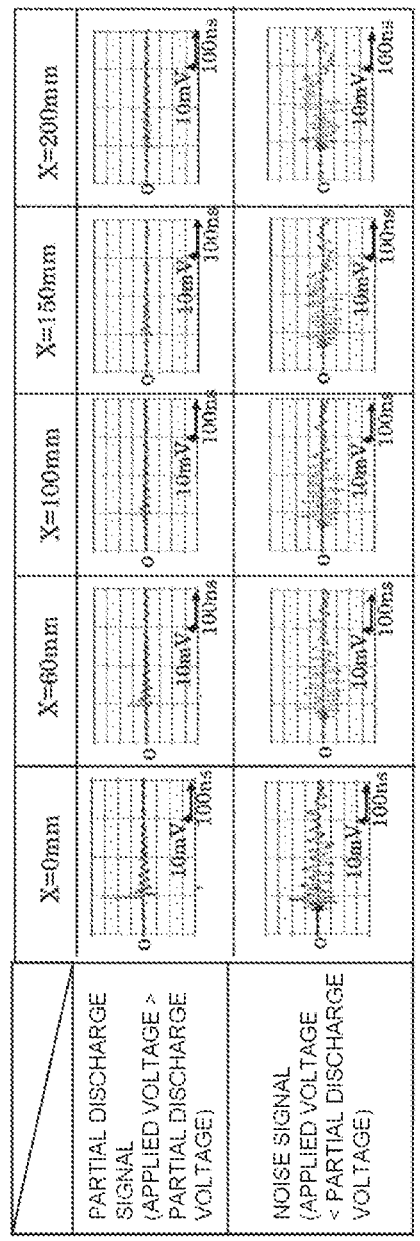
FIG. 8 is an exemplary data table obtained from the test in FIG. 7.
Figure 9:
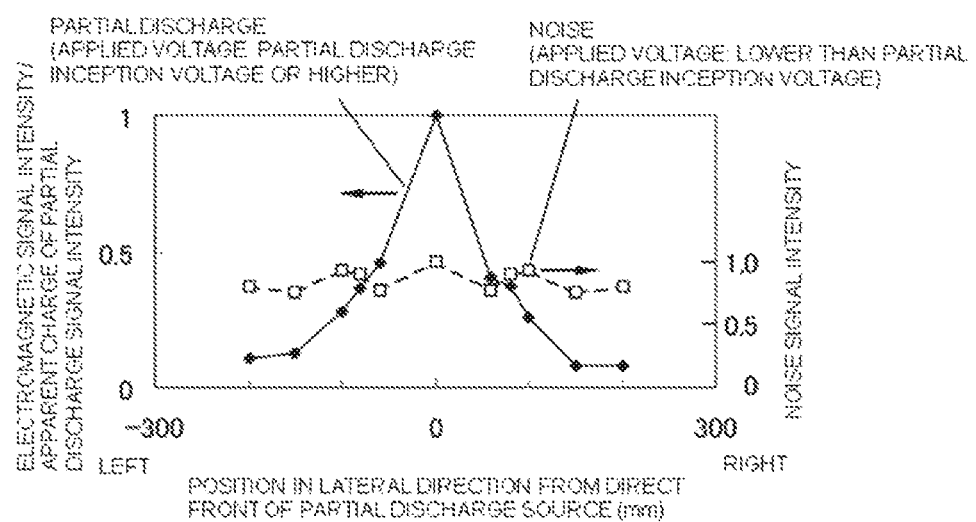
FIG. 9 is exemplary space distribution of electromagnetic signals of partial discharge and noise obtained from the test in FIG. 7.

FIGS. 7 to 9 illustrate results of verification tests for the principles of the above-described invention. FIG. 7 illustrates a test circuit for measuring electromagnetic signal spatial intensity distribution for electromagnetic waves and noise emitted from a partial discharge source. FIG. 8 illustrates exemplary waveform data of electromagnetic signal measurement for partial discharge signals and noise signals. Further, the partial discharge signal is measured by applying voltage equal to or higher than partial discharge inception voltage, and the noise is measured by applying voltage less than the partial discharge inception voltage. A direct front position of a discharge source is defined as X=0 mm, and a distance in a lateral direction is defined as X. In the case of the partial discharge signal, a signal peak rapidly drops as the distance X is increased. On the other hand, in the case of the noise signal, signal having a substantially constant level is observed regardless of the distance X. In FIG. 9, the partial discharge signal intensity is represented by a ratio against the signal intensity simultaneously measured by the apparent charge of partial discharge detector 10 in FIG. 1, and the noise signal intensity is represented by measured noise signal intensity, each having a horizontal axis set as the distance X. Here, the diagram is formed in a standardized manner in order to relatively compare the spatial intensity distribution of levels (energy) between the measured partial discharge signal intensity and noise signal intensity. Further, in FIG. 9, a peak value of the partial discharge signal intensity/apparent charge of partial discharge signal intensity, and a peak value of the measured noise signal intensity are represented in a standardized manner so as to become 1 respectively (represented by using the vertical axes on right and left sides). As a result, in the case of the partial discharge signal, intensity at a peak is high, but the intensity at the positions in the lateral direction is lower. In contrast, in the case of noise, intensity at a peak is generally low, but the signal is emitted in a broad range. Judging from the above results, it is proved that the principles of separating partial discharge from noise according to the present invention is appropriate.

REFERENCE SIGNS LIST 1 high-voltage test power source
2 sample
3 partial discharge defect inside sample
4 electromagnetic sensor
5 electromagnetic signal measuring instrument
6 signal spatial intensity distribution comparator
7 device for partial discharge/noise detection, defect position location, and risk assessment
9 electromagnetic spatial signal intensity distribution of partial discharge
10 apparent charge of partial discharge detector
23 rotating electrical machine
24 stator
25 stator winding
26 rotor
27 frame
34 high-voltage electrode
33 insulation layer
35 ground potential layer
40-45, 51-53 electromagnetic sensor
55 single coil of rotating electrical machine
56 high-voltage test power source

The invention claimed is:

1. A partial discharge measurement method, comprising:
   simultaneously measuring electromagnetic waves generated in a sample by a plurality of electromagnetic sensors;
   separating partial discharge from noise by comparing spatial intensity distribution of the measured electromagnetic waves with preliminarily-measured signal spatial intensity distribution at the time of occurrence of partial discharge,
   detecting a defect position using a peak position of the separated partial discharge signal;
   measuring a discharge amount signal by an apparent charge of partial discharge detector along with the electromagnetic signal measurement; and
   assessing a risk of partial discharge defect at the defect position based on the discharge amount signal.

2. The partial discharge measurement method according to claim 1, wherein relative positions of the plurality of electromagnetic sensors are fixed.

3. The partial discharge measurement method according to claim 2, wherein the plurality of electromagnetic sensors kept in the fixed relative positions is moved to detect a high-risk defect position inside a device.

4. The partial discharge measurement method according to claim 1, wherein the partial discharge defect is detected by sweeping the electromagnetic sensors to a coil end portion projecting from a core of a rotating electrical machine or a slot opening portion, wherein relative positions of the plurality of electromagnetic sensors are fixed.

5. The partial discharge measurement method according to claim 1, wherein the partial discharge defect is detected by sweeping the electromagnetic sensors along an axial direction of a single coil, wherein relative positions of the plurality of electromagnetic sensors are fixed.

6. A high-voltage device comprising:
   a coil conductor applied with high voltage; and
   an insulation member disposed around the coil conductor, wherein
   electromagnetic waves generated in a sample are simultaneously measured by a plurality of electromagnetic sensors,
   partial discharge and noise are separated by comparing spatial intensity distribution of the measured electromagnetic waves with preliminarily-measured signal spatial intensity distribution at the time of occurrence of partial discharge,
   a defect position is detected using a peak position of the separated partial discharge signal,
   a discharge amount signal is measured by an apparent charge of partial discharge detector along with the electromagnetic signal measurement,
   a risk of partial discharge defect at the defect position is assessed based on the discharge amount signal, and
   a sign of failure at a high-risk site is assessed by continuously monitoring the discharge amount signal at the defect position.

7. A partial discharge measurement system, comprising:
   a plurality of electromagnetic sensors; and
   an apparent charge of partial discharge detector, wherein the partial discharge measurement system is configured to:
   simultaneously measure electromagnetic waves generated in a sample by the plurality of electromagnetic sensors;
   separate partial discharge from noise by comparing spatial intensity distribution of the measured electromagnetic waves with preliminarily-measured signal spatial intensity distribution at the time of occurrence of partial discharge,
   detect a defect position using a peak position of the separated partial discharge signal;
   measure a discharge amount signal by the apparent charge of partial discharge detector along with the electromagnetic signal; and
   assess a risk of partial discharge defect at the defect position based on the discharge amount signal.

8. The partial discharge measurement system according to claim 7, wherein electric-optic conversion and photo-electric conversion are used in at least one of signal connecting portions of an electromagnetic signal measuring instrument, a signal spatial intensity distribution comparator, and a device for partial discharge/noise detection, defect position location, and risk assessment.

* * * * *